(12) United States Patent
Koning et al.

(10) Patent No.: US 8,629,731 B2
(45) Date of Patent: Jan. 14, 2014

(54) MEMS RESONATOR

(75) Inventors: Jan Jacob Koning, Wijchen (NL); Jozef Thomas Martinus Van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 86 days.

(21) Appl. No.: 13/128,059

(22) PCT Filed: Nov. 10, 2009

(86) PCT No.: PCT/IB2009/054994
§ 371 (c)(1),
(2), (4) Date: May 6, 2011

(87) PCT Pub. No.: WO2010/052683
PCT Pub. Date: May 14, 2010

(65) Prior Publication Data
US 2011/0215877 A1    Sep. 8, 2011

(30) Foreign Application Priority Data
Nov. 10, 2008    (EP) .................................... 08105756

(51) Int. Cl.
*H03L 1/00* (2006.01)
(52) U.S. Cl.
USPC ........... 331/176; 331/70; 331/116 R; 331/154
(58) Field of Classification Search
USPC .................. 331/70, 116 R, 154, 175, 176
See application file for complete search history.

(56) References Cited

U.S. PATENT DOCUMENTS 3,732,443 A * 5/1973 Lovrenich .................... 327/512
4,023,094 A * 5/1977 Adams .......................... 324/610
2005/0195050 A1   9/2005 Lutz et al.
2006/0114541 A1 * 6/2006 Van Beek ..................... 359/224
2009/0146751 A1 * 6/2009 Pernia et al. ............... 331/117 R
2012/0075027 A1 * 3/2012 van Beek et al. ............... 331/70

FOREIGN PATENT DOCUMENTS

WO    2005/025057 A2    3/2005
WO    2005/096495 A1   10/2005
WO    2010/029490 A2    3/2010

OTHER PUBLICATIONS

Nguyen, C., et al. "Micromechanical Resonators for Oscillators and Filters", Proc. 1995 IEEE Ultrasonics Symposium, vol. 1, pp. 489-499 (Nov. 1995).
van der Pol, J., et al."A-BCD: An Economic 100V RESURF Silicon-On-Insulator BCD Technology for Consumer and Automotive Applications", Proc. Int. Symp. on Power Semiconductor Devices and Processes (ISPSD), pp. 327-330 (May 2000).
Kaajakari, V., et al. "Square-Extension Mode Single-Crystal Silicon Micromechanical Resonator for Low-Phase-Noise Oscillator Applications", IEEE Electron Device Letter, vol. 25, No. 4, pp. 173-175 (Apr. 2004).
Chandra, M., et al. "Thermal Isolation of Encapsulated MEMS Resonators", J. of Microelectromechanical Systems,, vol. 17, No. 1, pp. 175-184 (Feb. 2008).
International Search Report and Written Opinion for Int'l. Patent Application No. PCT/IB2009/054994 (May 21, 2010).

* cited by examiner

*Primary Examiner* — Robert Pascal
*Assistant Examiner* — Jeffrey Shin (57) ABSTRACT

A MEMS circuit comprises a MEMS device arrangement with temperature dependent output; a resistive heating circuit; and a feedback control system for controlling the resistive heating circuit to provide heating in order to maintain a MEMS device at a constant temperature. The heating is controlled in dependence on the ambient temperature, such that a MEMS device temperature is maintained at one of a plurality of temperatures in dependence on the ambient temperature. This provides power savings because the temperature to which the MEMS device is heated can be kept within a smaller margin of the ambient temperature.

15 Claims, 4 Drawing Sheets

MEMS RESONATOR

This invention relates to MEMS resonators.

MEMS resonators are widely used as a reference oscillator in RF receiver circuits. The resonance frequency of a MEMS resonator exhibits a temperature drift of typically −30 ppm/K. For some applications this drift needs to be reduced significantly. For example, when using a MEMS resonator in a GSM reference oscillator, the drift needs to be below +/−10 ppm over a temperature range of 100K.

This can be achieved by keeping the resonator at a constant temperature by placing the resonator in a temperature controlled feedback loop. In this case, the temperature is measured on, or in close vicinity of the resonator. This temperature is than stabilized by heating the resonator to a preset temperature.

WO2005/025057 discloses that this temperature control can be achieved by placing the resonator in a Wheatstone bridge. The electrical resistance of parts of the resonator are used for both temperature sensing as well as heating.

Figure 1:
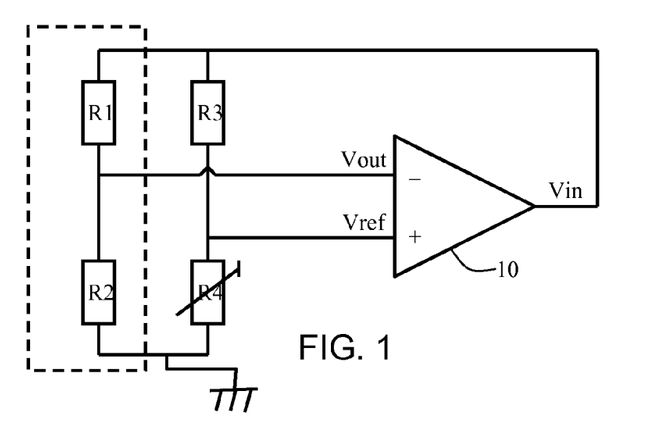
FIG. 1 shows a known Wheatstone bridge feedback control circuit and which is used in an example control system of the invention.

FIG. 1 is used to explain this known heating control concept. The series connected resistors R1 and R2 are part of the resonator and have a different temperature coefficient (TC). These two resistors form a first branch between an input voltage Vin and ground. Series connected resistors R3 and R4 are placed elsewhere at equal temperature, and they have the same temperature coefficient. They define a second branch in parallel with the first branch.

The feedback control system uses a differential amplifier 10 which receives as inputs the voltage at the junction between the first and second resistors R1,R2, and the voltage at the junction between the third and fourth resistors R3,R4.

The voltage difference Vout−Vref is zero when the ratio of the resonator resistors R1/R2 is equal to the ratio of the circuit resistances R3/R4, which is only valid for a unique temperature.

This voltage difference Vout−Vref is amplified and fed back into the Wheatstone bridge as the supply voltage rail, thereby heating up R1 and R2 until Vout−Vref equals zero and R1 and R2 reach their unique temperature.

Thus, the circuit of FIG. 1 provides heating until a fixed temperature is reached, which depends on the values of the resistances in the circuit.

A problem with heating to a fixed temperature is that this temperature needs to be above the permitted ambient temperature operating range of the device. This means there is potentially a large amount of wasted power dissipation.

According to the invention, there is provided a MEMS circuit, comprising:

a MEMS device arrangement with temperature dependent output;

a resistive heating circuit;

a feedback control system for controlling the resistive heating circuit to provide heating in order to maintain a MEMS device at a constant temperature; and means for controlling the heating in dependence on the ambient temperature, such that a MEMS device temperature is maintained at one of a plurality of temperatures in dependence on the ambient temperature.

This circuit has different temperature settings, so that the temperature difference (between ambient temperature and the temperature to which the device is heated) is kept to smaller amounts. This reduces the power consumption of the heating circuit.

In one arrangement, the MEMS device arrangement can comprise a plurality of MEMS devices, and wherein the means for controlling can comprise a switching arrangement for controlling which MEMS device is heated in dependence on the ambient temperature. The heated MEMS device is then used to provide the output of the MEMS circuit.

Thus, different MEMS devices are used for different temperatures. The outputs of the different devices are stable for their temperature range, and preferably all MEMS devices provide the same output level.

Alternatively, the MEMS device arrangement can comprises a single MEMS device and a plurality of heating circuits, and wherein the means for controlling can comprise a switching arrangement for controlling which heating circuit is operated in dependence on the ambient temperature.

The MEMS device may provide a different output when at different temperatures, but the output can be stable for a particular temperature.

The MEMS device or devices can comprise a resonator or resonators.

In one example, the or each resonator comprises:

a resonator body; and an anchor, which provides a fixed connection between the resonator body and a support body, wherein the resistive heating circuit comprises first and second ends which are exposed to ambient temperature, wherein the resistive heating circuit provides an output voltage which is supplied to the feedback control system for maintaining a fixed temperature based on the output voltage, and wherein the anchor is thermally coupled to a location of the resistive heating circuit which has a lowest dependency of its temperature on the ambient temperature during the operation of the feedback control.

This arrangement provides thermal coupling between the resonator body and the resistive heating circuit through an anchor. This means that the resistive heating current does not need to pass through the resonator itself. The heating current only passes the anchors through which the resonator is connected to the support structure (substrate). In this way, only the anchors have a non-uniform temperature profile and the resonator has a single temperature taken from the point at which it connects to the anchor.

By thermally coupling the anchor to a location of the resistive heating circuit which has a lowest dependency of its temperature on the ambient temperature, the temperature of the resonator remains more stable. The feedback system is able to maintain an accurate temperature for the resonator, and the feedback system is far less sensitive to ambient temperature variations.

The resistive heating circuit can comprise first and second resistors in series, with the output voltage defined at the junction between the resistors. Thus, the resistive hearting circuit can form part of the Wheatstone bridge circuit explained above.

The resistive heating circuit can comprise first and second portions which are aligned end to end which define the first and second resistors, and a perpendicular portion extending from the junction between the first and second portions, and which defines an output spur. The output spur is for providing the feedback voltage. The first and second portions then have different temperature dependency of their electrical resistance so that a specific temperature corresponds to a particular ratio of the two resistance values.

In the Wheatstone bridge circuit, the first and second resistors form a first branch, and third and fourth series-connected resistors form a second, parallel, branch. The feedback control system then further comprises a differential amplifier which receives as inputs the voltage at the junction between the first and second resistors, and the voltage at the junction between the third and fourth resistors, the output of the amplifier being provided to one end of the two branches. This amplifier output is then the supply voltage for the heating circuit.

The location of the resistive heating circuit is typically different to the point from which the output voltage is derived. This is because the output voltage is derived from the junction between two resistors, whereas the location (to which the anchor connects) is selected so that ambient temperature variations have the lowest effect.

The invention also provides a method of controlling a MEMS circuit having a MEMS device arrangement with temperature dependent output, the method comprising:

controlling a resistive heating circuit to provide heating in order to maintain a MEMS device at a constant temperature;

wherein the heating is in dependence on the ambient temperature, such that a MEMS device arrangement temperature is maintained at one of a plurality of temperatures in dependence on the ambient temperature.

In one example, the MEMS device arrangement comprises a plurality of MEMS devices, and wherein the controlling comprises controlling which MEMS device is heated in dependence on the ambient temperature, and wherein the method further comprises using the heated MEMS device to provide the output of the MEMS circuit.

In another example, the MEMS device arrangement comprises a single MEMS device and a plurality of heating circuits, and wherein the controlling comprises controlling which heating circuit is operated in dependence on the ambient temperature.

Examples of the invention will now be described in detail with reference to the accompanying drawings, in which.

The same reference numbers have been used in different figures to denote the same components and layers, and the description is not repeated.

The invention provides a MEMS circuit in which feedback control is used to control a resistive heating circuit to provide heating in order to maintain a MEMS device at a constant temperature. The heating is controlled in dependence on the ambient temperature, such that a MEMS device temperature is maintained at one of a plurality of temperatures in dependence on the ambient temperature. The temperature difference (between ambient temperature and the temperature to which the device is heated) is in this way kept to smaller amounts to reduce the power consumption of the heating circuit.

The applicant has proposed a modified heating arrangement, and this will first be described, before the additional features in accordance with this invention are explained.

The one-dimensional heat equation of an electrical and heat conducting body through which a electrical current flows is given by:

$$\frac{\partial^2 T}{\partial x^2} = j^2 \frac{\rho}{\kappa} \quad (1)$$

with heat conductivity $\kappa$, electrical resistivity $\rho$, and current density j. It is assumed that heat conduction of the body dominates over other mechanisms of heat transport (e.g. radiation, convection). For MEMS resonators, this is a valid assumption.

From equation (1) it can be seen that the curvature, $$\frac{\partial^2 T}{\partial x^2}$$

of the temperature profile cannot equal zero when an electrical heating current is flowing through the MEMS resonator. This means that it is not possible to have a uniform temperature inside of the MEMS resonator when a heating current is applied through the resonator. As a result, the feedback mechanism may not provide correct control of the resonator electrical characteristics, as the measured temperature may not accurately reflect the temperature of the MEMS device.

Figure 2:
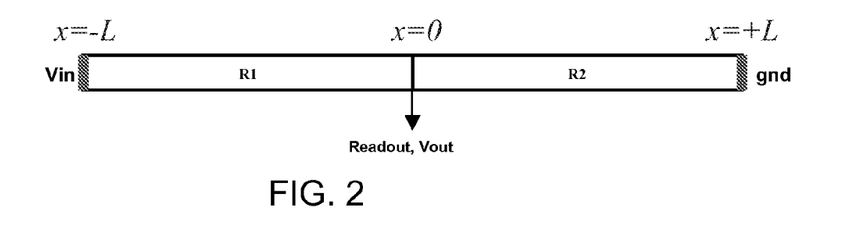
FIG. 2 shows a resistive heating element which can be used in the system of the invention.

FIG. 2 shows a resistive heating element which has been proposed by the applicant, and which can be used in the system of the invention. The resistive heating element comprises two resistors R1 and R2, which form the temperature regulation feedback loop shown in FIG. 1.

The feedback loop does not automatically result in a constant temperature of the resonator, since R1 and R2 have a non-uniform temperature along their length (see equation 1). This can easily be understood considering the ends of R1 and R2, which are connected to the substrate. The substrate is at ambient temperature, which is the variable that needs to be compensated. Therefore, the temperature at the resistor ends cannot be compensated.

It will be shown below that there are locations along R1 and/or R2 that have almost constant temperature when placing these resistors in the feedback loop shown in FIG. 1.

The anchor layout proposed incorporates the resistors R1 and R2, and defines the location where the MEMS resonator is connected to the anchor so as to have a constant temperature as a result of the feedback control system, for example of the type shown in FIG. 1.

The principle of heating the resonator to a defined temperature is shown in FIG. 2. By applying a voltage (Vin) on one end of the resistor element, a current will flow through the resistors R1 and R2, which will heat up the resistors. The voltage Vout is read out between R1 and R2. The ends of R1 and R2 are held at ambient temperature, as is indicated by the bold lines, and are the locations where heat can escape to the outside world.

Simple solutions for the temperature profile T(x) can be derived assuming the temperature coefficient, $\alpha$ of R1 and R2 is small, and assuming the heat conduction, $\kappa$ is not dependent on temperature. For the temperature profiles in R1 and R2 the following set of differential equations are valid:

$$-L < x < 0 \rightarrow \beta_1 \frac{\partial^2 T_1}{\partial x^2} + 1 = 0 \quad (2)$$

$$0 < x < L \rightarrow \beta_2 \frac{\partial^2 T_2}{\partial x^2} + 1 = 0$$

where $\beta_1$ and $\beta_2$ are defined as $$\beta_1 = \frac{\kappa}{\rho_1 j^2} \text{ and } \beta_2 = \frac{\kappa}{\rho_{21} j^2}$$

The following boundary conditions are valid, $$T_1(-L) = T_2(L) = T_0 \quad (3)$$
$$T_1(0) = T_2(0)$$
$$\frac{\partial T_1}{\partial x}(0) = \frac{\partial T_2}{\partial x}(0)$$

The solutions to the equations (2) and (3) is given by, $$-L < x < 0 \rightarrow T_1(x) = -\frac{1}{2\beta_1} x^2 + A_1 x + B_1 \quad (4)$$

$$0 < x < L \rightarrow T_2(x) = -\frac{1}{2\beta_2} x^2 + A_1 x + B_1$$

$$A_1 = -\frac{L}{4}\left(\frac{1}{\beta_1} - \frac{1}{\beta_2}\right)$$

$$B_1 = T_0 + \frac{L^2}{4}\left(\frac{1}{\beta_1} + \frac{1}{\beta_2}\right)$$

To keep the solution (4) simple it has been assumed that the temperature coefficient of both resistors is negligible. However, for the temperature feedback depicted in FIG. 1, the temperature coefficient cannot be zero.

In the Wheatstone feedback configuration, the ratio Vin/Vout, or equivalently R1/R2 is kept constant. These ratios should be dependent on temperature. From now on it is assumed that the temperature coefficient of the resistors has a (small but) finite value of temperature coefficient of resistance, $\alpha$. The value of R1 and R2 as function of temperature are now given by:

$$R_1 = \frac{1}{A} \int_{-L}^{0} \rho_1 (1 + \alpha_1 T_1(x)) dx \quad (5)$$

$$R_2 = \frac{1}{A} \int_{0}^{L} \rho_2 (1 + \alpha_2 T_2(x)) dx$$

The ratio R1/R2 that is kept constant by the feedback loop is given by, $$\frac{R_1}{R_2} = \frac{\rho_1}{\rho_2} \frac{1 + \alpha_1 \left(T_0 + \frac{L^2}{24}\left(\frac{5}{\beta_1} + \frac{3}{\beta_2}\right)\right)}{1 + \alpha_2 \left(T_0 + \frac{L^2}{24}\left(\frac{3}{\beta_1} + \frac{5}{\beta_2}\right)\right)} \quad (6)$$

The part between brackets in the nominator and denominator represent the effective temperature T1 and T2 of R1 and R2, respectively.

It can be found where along the resistors this effective temperature is reached by combining these effective temperatures with equation (4):

$$T_1 = T_0 + \frac{L^2}{24}\left(\frac{5}{\beta_1} + \frac{3}{\beta_2}\right) \quad (7)$$

$$T_2 = T_0 + \frac{L^2}{24}\left(\frac{3}{\beta_1} + \frac{5}{\beta_2}\right)$$

$$T_1 = -\frac{1}{2\beta_1} x^2 - \frac{L}{4}\left(\frac{1}{\beta_1} - \frac{1}{\beta_2}\right) x + \frac{L^2}{4}\left(\frac{1}{\beta_1} + \frac{1}{\beta_2}\right) + T_0 \quad (8)$$

$$T_2 = -\frac{1}{2\beta_2} x^2 - \frac{L}{4}\left(\frac{1}{\beta_1} - \frac{1}{\beta_2}\right) x + \frac{L^2}{4}\left(\frac{1}{\beta_1} + \frac{1}{\beta_2}\right) + T_0$$

Combining (7) and (8) it can easily be seen that the solution for x is independent of ambient temperature $T_0$.

This means that there are locations on the two resistors where the temperature does not change with ambient temperature $T_0$. Connecting the resonator to one of these points will result in a uniform constant temperature $T_1$ or $T_2$ of the resonator regardless of the ambient temperature $T_0$. The location of these points are given by:

$$-L < x < 0 \rightarrow x = \frac{L}{4}\left(\frac{\rho_2}{\rho_1} - 1 - \sqrt{\left(\frac{\rho_2}{\rho_1}\right)^2 + 2\frac{\rho_2}{\rho_1} + \frac{7}{3}}\right) \quad (9)$$

$$0 < x < L \rightarrow = \frac{L}{4}\left(1 - \frac{\rho_1}{\rho_2} + \sqrt{\frac{7}{3} + 2\frac{\rho_1}{\rho_2} + \left(\frac{\rho_1}{\rho_2}\right)^2}\right)$$

Equations (2) till (9) are only valid when:
The temperature coefficient of resistance a is small;
The heat conduction coefficient $\kappa$ is not dependent on temperature; and
The heat loss to the outside world is only through the ends of R1 and R2.

In reality only the first condition is valid. For silicon, the heat conduction is strongly dependent on temperature. Furthermore, the terminal that is needed to provide a voltage feedback signal (Vout) is a third path through which heat can be transported to the outside world.

Finite element simulations have been performed in order to take these effects into account. The layout that is simulated is shown in FIG. 3.

Figure 3:
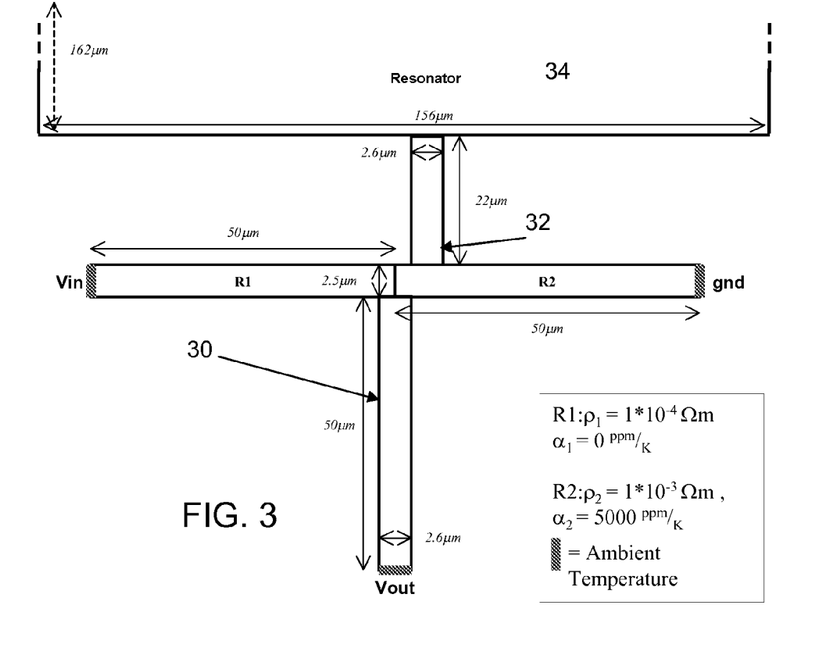
FIG. 3 shows how the resistive heating element of FIG. 2 is coupled to the resonator and how the electrical output signal is derived.

FIG. 3 shows the first and second resistors R1 and R2 in series, with the output voltage Vout defined at the junction between the resistors. The resistors R1 and R2 are defined as resistive track portions, with track width 2.5 μm and track length 50 μm. The first and second portions are aligned end to end. A perpendicular readout portion extends from the junction between the first and second portions, and defines an output spur 30. This also has length 50 μm and width 2.6 μm.

The first and second portions have different temperature dependency of their electrical resistance. The modelled example has resistivity of $10^{-4}$ Ωm and temperature coefficient $\alpha = 0$ for resistor R1, and resistivity of $10^{-3}$ Ωm and temperature coefficient $\alpha = 5000$ ppm/K for resistor R2 (at a reference temperature, such as room temperature).

The anchor is shown as 32 and this connects to the resonator body 34. The anchor has length 22 μm and width 2.6 μm. As shown, the anchor does not connect to the location of the junction between resistors R1 and R2. Instead, the location of the connection between the anchor and the resonator is explained below.

The anchor can be an electrical insulator or conductor, and should preferably be a good thermal conductor. The readout spur is an electrical conductor to enable the voltage to be read. All elements can be made out of a semiconductor for example silicon.

The resonator is connected to a support body through the anchor. In practice, the support body, anchor and resonator can all be part of the same layer, with trenches formed to define the resonator mass as an independent component, but with the anchor or anchors providing connections.

Figure 4:
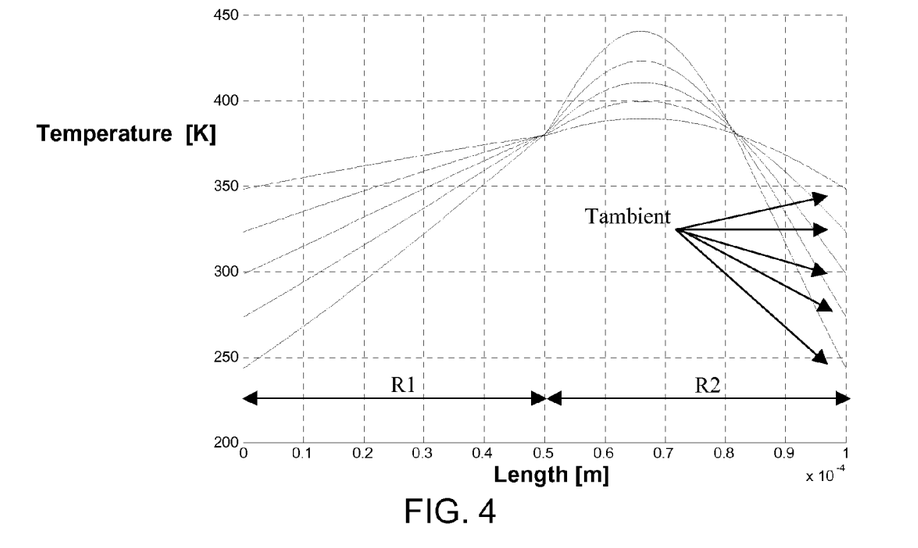
FIG. 4 is a first graph to show the effect of ambient temperature variations on the operation temperature at different points along the heating element.

The output of the simulation is the temperature profile along R1 and R2. In FIG. 4, the temperature across R1 (from length 0-50 μm) and R2 (50-100 μm) is represented. The dimensions and values for R1 and R2 (resistivity and temperature coefficient) that were used are given in FIG. 3. The results are shown as a table below and are plotted in the graph of FIG. 4.

| Tambient [K] | Vinput [V] | Vreadout [V] | J*10$^7$ [A/m$^2$] | I [uA] | R1 [Ohm] | R2 [Ohm] | P [mW] |
|---|---|---|---|---|---|---|---|
| 348 | 5.5738 | 5.2035 | 7.5012 | 262.5 | 1410.4 | 19819.7 | 1.46 |
| 323 | 7.619 | 7.1128 | 10.254 | 358.9 | 1410.3 | 19819.0 | 2.73 |
| 298 | 9.3184 | 8.6993 | 12.541 | 438.9 | 1410.3 | 19819.2 | 4.09 |
| 273 | 10.8512 | 10.1303 | 14.603 | 511.1 | 1410.4 | 19820.4 | 5.55 |
| 243 | 12.5806 | 11.7448 | 16.931 | 592.6 | 1410.4 | 19819.7 | 7.46 |
| Ratio Vreadout/Vinput = | 0.93357 | | | | | | |

This table is a simulation in which a constant ratio of resistance values (R1 and R2) is obtained, and shows the heating element drive current (I), the heating element power consumption (P), the current density (J), the ambient temperature (Tambient), the heating element drive voltage (Vinput) and the readout voltage (Vreadout).

From the graph of FIG. 4, it is clear that there are two points where the temperature is approximately constant at about 380K, one at about 50 μm and one around 82 μm. If the anchor of the resonator is connected at one of these points the resonator will be kept at 380K despite the changes of the ambient temperature. The ambient temperatures can be seen as the values at distances 0 and 100 μm.

The position of the anchor on the resistors determines the temperature fluctuation of the resonator. To determine the best position of the anchor, a simulation has been implemented in which the anchor is shifted along the resistors around the 50 μm point in steps on 0.1 μm.

At every step, the temperature of the resonator was determined for the ambient temperatures 348K, 323K, 298K, 273K and 243K.

Figure 5:
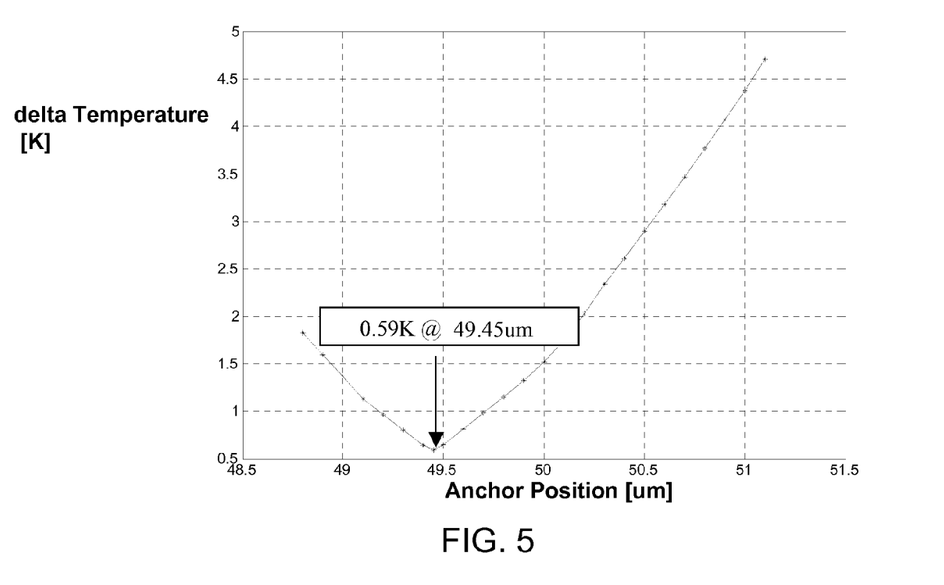
FIG. 5 is a second graph to show the effect of ambient temperature variations on the operation temperature at different points along the heating element.

FIG. 5 shows the difference of the maximum and minimum temperature at each position. From this graph it is clear that the best position of the anchor for heating up the resonator is at 49.45 μm. Here the temperature of the resonator, within the ambient temperature range of 348K to 243K, will have a variation of 0.59K. The variation of ambient temperature is therefore reduced by a factor of 178 at this particular location.

The proposed resonator design is based on this recognition that there is an optimum point along the heating resistor to make the thermal connection to the resonator mass.

Figure 6:
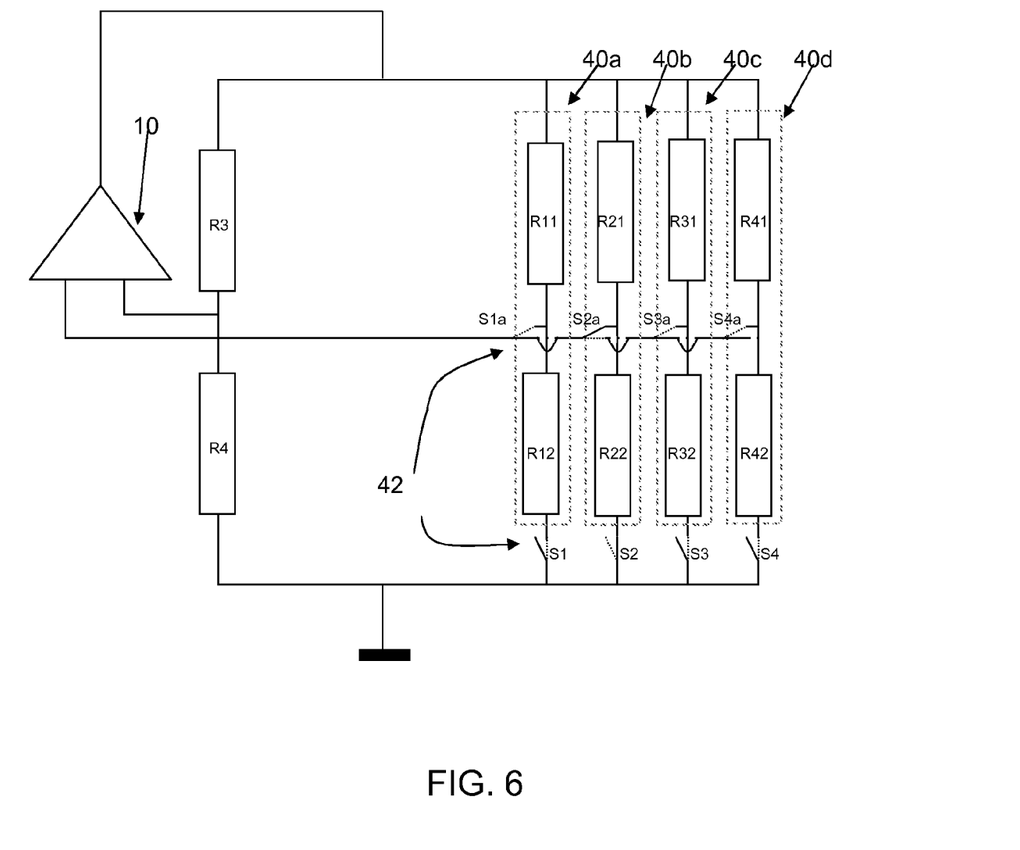
FIG. 6 shows a first example of circuit of the invention.

FIG. 6 shows a first example of MEMS circuit of the invention. The invention is described with reference to resonators, which have an output frequency which depends on temperature. However, the invention is applicable to other MEMS devices, which have output dependent on temperature and therefore need temperature compensation to provide a stable output with constant output transfer function.

In FIG. 6, the heating circuit is formed by resistors R1 and R2, with feedback using a parallel branch R3,R4, in the same way as shown in FIG. 1. However, the circuit has four resonators 40a, 40b, 40c and 40d so that four integrated heating circuits are defined. The heating circuit of each resonator 40a-40d is represented by two resistors Rn1 and Rn2, where n is the resonator number 1 to 4. Each resonator is thus represented in the same way as in FIG. 1, and the mid point between the two resistors is the feedback point.

A switching arrangement 42 has a first switch for each resonator S1, S2, S3, S4 to connect the parallel resonator branch into the circuit, and a second switch S1a, S2a, S3a, S4a to connect the feedback mid-point to the amplifier 10. The switching arrangement 42 enables a selected one of the resonators to be connected into circuit, and thereby the heating feedback control is applied to one resonator only.

In the example shown, resonator number 2 (40b) is connected into the circuit, and this means switch S2 is the only one of the first switches which is closed, and switch S2a is the only one of the second switches which is open. The other resonators are not connected to the ground terminal, and their mid-points are also isolated from the amplifier 10. The feedback circuit behaves as if only resonator 40b exists.

The switches open and close at predefined temperature levels. The pairs of switches (e.g. S1 and S1a) are operated in complementary manner as explained above.

Figure 7:
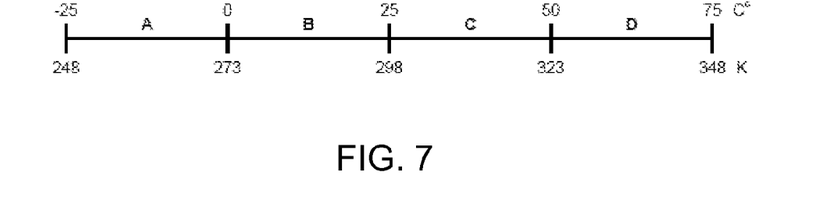
FIG. 7 shows a temperature scale divided into ranges, used in the circuit of the invention.

This implementation uses an array of 4 MEMS devices, thus dividing the temperature into 4 ranges. Each MEMS device has the desired resonance frequency in a different temperature interval. For example, each temperature range can be 25 degrees Celsius. The four ranges form a continuous 100 degree range as shown in FIG. 7. The temperature ranges A to D are for the resonators 40a to 40d.

If the ambient temperature is in range A, resonator 40a is selected. This is heated to a temperature just above the top of the temperature range, i.e. Tres,a=Ta,max+Tadd. This could be: Tres,a=273K+30K=303K for example. The additional temperature margin ensures the feedback control system correctly operates the control even when the temperature is at the top of the range (i.e. at Ta,max).

The maximum temperature difference with the environment is then Tdiff,max=Trange+Tadd=25+30=55 K. This maximum temperature difference corresponds to an ambient temperature at the bottom of the temperature range, i.e. 248 degrees, for the temperature range A.

As the heat losses are determined by the heat resistance of the anchor fixations, this gives a heat flux of 55 times the anchor heat resistance.

The advantage of this approach is that the division into smaller temperature ranges limits the heat flux. In the case of a single resonator, the maximum temperature difference of the heated resonator with the environment is 100K+30 K=130K and the heat flux is then 130 times the anchor resistance.

Heating the resonator to a constant temperature of 348+ 30=378K would thus use much more energy.

The specific resonator example described above is only one possible example of resonator design. Indeed, instead of using two resistors R1 and R2 as shown in FIGS. 1 and 4, just one resistor can be used in the anchor fixation, or the current may flow through the resonator. Instead of MEMS resonators, other MEMS devices like accelerometers or pressure sensors can be used in an array configuration as described. In the case of resonators, the aim is to provide a constant output frequency over temperature. Other MEMS devices may not be for providing a constant output, but nevertheless should have a constant output transfer function with temperature. For example, a sensor should provide a measure of a parameter (pressure or force for example) which does not vary with temperature.

The above described construction to stabilize the MEMS device temperature makes the device temperature largely independent of ambient temperature.

The invention can be applied to other resonator designs, and is not limited to the arrangement (or concept) explained with reference to FIG. 3. For example, the invention can be applied to an array of MEMS resonators where a heating current flows through the whole device from one anchor to another anchor.

Figure 8:
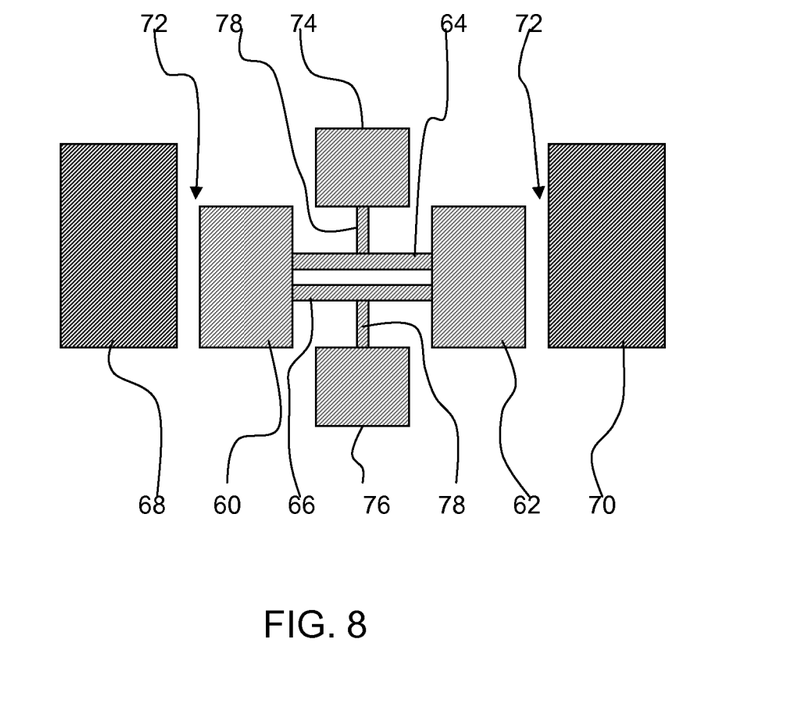
FIG. 8 shows a second example of circuit of the invention.

This structure is shown in FIG. 8. The resonator has a so-called "dogbone" configuration with two resonator heads 60,62 (the suspended parts of the resonator) connected by beams 64,66 which function as springs. Actuation electrodes 68,70 are provided at each side, to which a combined dc and ac actuation voltage is applied, for electrostatic actuation across the gap 72.

Bond pads 74,76 on the top and bottom conduct current through the suspended thin anchors 78, resonator springs 64,66 and the resonator heads 60,62. The ambient temperature is present at the rectangular bond pads 74,76. Heating in the springs 64,66 causes the MEMS to be at an elevated temperature, but due to the temperature gradient in the anchor springs, the device temperature will be more dependent on the ambient temperature for a fixed heating current.

By selecting the optimized device for a specific temperature range, the temperature dependency of the resonant frequency can still be reduced, while the heating power is reduced by staying within the appropriate temperature range for a reduced heat gradient. This approach can be combined with temperature sensing elsewhere (outside the MEMS device but for instance on the same chip or in the same chip package).

This example is to show that the invention is not limited to the type of resonator explained with reference to FIG. 3.

In the example above, multiple resonators are provided. However, the invention can also be applied to a single resonator (or more generally a single MEMS device), but with multiple feedback control regimes.

Thus, instead of using an array configuration of MEMS devices, one single device with an array of temperature control circuits can be used, for which the heat losses will also be diminished by making use of the reduced temperature regions. In the case of a resonator, this will result in slightly different frequencies for each temperature range, but the frequency can be kept stable within such a temperature range.

The device can be fabricated using standard known techniques, for example a SOI based IC process. Typically, trenches are etched in the buried oxide layer, and the buried oxide layer is etched away from beneath the MEMS device to form a cavity.

A difference in temperature coefficient for different resistors can be realized by means of doping with a different doping level. It is known that differences in doping level results in differences of temperature coefficient, for example this is well known for p-type and n-type silicon.

The resonator design has not been described in detail in the description above, as the invention relates to the multiple resonator or multiple temperature control arrangement. Many different resonator designs can be used, and this will be apparent to those skilled in the art. Similarly, the materials used have not been described in detail, as this will be routine as entirely conventional processes and materials can be used.

Only a single example of feedback control system (FIG. 1) has been described. However, the invention can be applied to other circuits which aim to provide a fixed temperature.

Various modifications will be apparent to those skilled in the art.

The invention claimed is:

1. A MEMS circuit, comprising:
a MEMS device arrangement with temperature dependent output;
a resistive heating circuit;
a feedback control circuit for controlling the resistive heating circuit to provide heating to maintain a MEMS device at a constant temperature; and
a control circuit for controlling the heating in dependence on an ambient temperature, such that a MEMS device temperature is maintained at one of a plurality of temperatures in dependence on the ambient temperature.

2. A circuit as claimed in claim 1, wherein the MEMS device arrangement comprises a plurality of MEMS devices, and wherein the control circuit comprises a switching arrangement for controlling which MEMS device is heated in dependence on the ambient temperature, wherein the heated MEMS device is used to provide the output of the MEMS circuit.

3. A circuit as claimed in claim 1, wherein the MEMS device arrangement comprises a single MEMS device and a plurality of heating circuits, and wherein the control circuit comprises a switching arrangement for controlling which heating circuit is operated in dependence on the ambient temperature.

4. A circuit as claimed in claim 1, wherein the MEMS device comprises a resonator.

5. A circuit as claimed in claim 4, wherein the resonator comprises:
a resonator body; and
an anchor, which provides a fixed connection between the resonator body and a support body,
wherein the resistive heating circuit has first and second ends which are exposed to ambient temperature,
wherein the resistive heating circuit provides an output voltage which is supplied to the feedback control circuit for maintaining a fixed temperature based on the output voltage,
and wherein the anchor is thermally coupled to a location of the resistive heating circuit which has a lowest dependency of its temperature on the ambient temperature during the operation of the feedback control.

6. A circuit as claimed in claim 5, wherein the resistive heating circuit comprises first and second resistors in series, with the output voltage defined at a junction between the resistors.

7. A circuit as claimed in claim 6, wherein resistive heating circuit comprises first and second portions which are aligned end to end which define the first and second resistors, and a perpendicular portion extending from the junction between the first and second portions, and which defines an output spur.

8. A circuit as claimed in claim 7, wherein the first and second portions have different temperature dependency of their electrical resistance.

9. A circuit as claimed in claim 6, wherein the feedback control circuit comprises a Wheatstone bridge defined by the first and second resistors forming a first branch, and third and fourth series-connected resistors forming a second, parallel, branch.

10. A circuit as claimed in claim 9, wherein the feedback control circuit further comprises a differential amplifier which receives as inputs the voltage at the junction between the first and second resistors, and the voltage at the junction between the third and fourth resistors, the output of the amplifier being provided to one end of the two branches.

11. A circuit as claimed in claim 5, wherein an anchor location of the resistive heating circuit is different to the point from which the output voltage is derived.

12. A method of controlling a MEMS circuit having a MEMS device arrangement with temperature dependent output, the method comprising:

controlling a resistive heating circuit (R1,R2) to provide heating in order to maintain a MEMS device at a constant temperature;

wherein the heating is in dependence on an ambient temperature, such that a MEMS device arrangement temperature is maintained at one of a plurality of temperatures in dependence on the ambient temperature.

13. A method as claimed in claim 12, wherein the MEMS device arrangement comprises a plurality of MEMS devices, and wherein the controlling comprises controlling which MEMS device is heated in dependence on the ambient temperature, and wherein the method further comprises using the heated MEMS device to provide the output of the MEMS circuit.

14. A circuit as claimed in claim 12, wherein the MEMS device arrangement comprises a single MEMS device and a plurality of heating circuits, and wherein the controlling comprises controlling which heating circuit is operated in dependence on the ambient temperature.

15. A method as claimed in claim 12, wherein the controlling comprises operating a Wheatstone bridge circuit.

* * * * *